United States Patent
Pachler et al.

(10) Patent No.: US 9,328,900 B2
(45) Date of Patent: May 3, 2016

(54) PACKAGED LED MODULE

(75) Inventors: Peter Pachler, Graz (AT); Janos Dobos, Szombathely (HU); Roland Peinsipp, Gleisdorf (AT)

(73) Assignees: Tridonic Jennersdorf GmbH, Jennersdorf (AT); Tridonic GmbH & Co. KG, Dornbirn (AT)

( * ) Notice: Subject to any disclaimer, the term of this patent is extended or adjusted under 35 U.S.C. 154(b) by 376 days.

(21) Appl. No.: 13/817,674

(22) PCT Filed: Aug. 17, 2011

(86) PCT No.: PCT/EP2011/064136
§ 371 (c)(1),
(2), (4) Date: Apr. 2, 2013

(87) PCT Pub. No.: WO2012/022760
PCT Pub. Date: Feb. 23, 2012

(65) Prior Publication Data
US 2013/0183779 A1    Jul. 18, 2013

(30) Foreign Application Priority Data

Aug. 20, 2010 (DE) .......................... 10 2010 039 592
Feb. 3, 2011 (DE) .......................... 10 2011 003 608

(51) Int. Cl.
*G02B 6/43* (2006.01)
*F21V 19/00* (2006.01)
(Continued)

(52) U.S. Cl.
CPC ................. *F21V 15/01* (2013.01); *F21S 4/001* (2013.01); *F21V 19/0035* (2013.01);
(Continued)

(58) Field of Classification Search
CPC . F21V 15/01–15/015; F21V 19/001–19/0055; G02B 6/4255; G02B 6/4219; G02B 6/4256–6/4262; G02B 6/42–6/4201; G02F 2013/222

USPC .................. 362/362–365, 367–369, 374–375
See application file for complete search history.

(56) References Cited

U.S. PATENT DOCUMENTS 7,215,886 B2 * 5/2007 Maruyama et al. ........... 398/117
7,253,444 B2 * 8/2007 Ikeda .............................. 257/81
(Continued)

FOREIGN PATENT DOCUMENTS

| DE | 199 04 915 A1 | 2/2001 | |
| DE | 19904915 A1 * | 2/2001 | .............. F21V 31/00 |
| DE | 20 2009 000236 U1 | 6/2010 | |

OTHER PUBLICATIONS

English translation of Publication No. DE19904915 A1, Schauer et al., Feb. 6, 1999.*

(Continued)

*Primary Examiner* — Laura Menz
*Assistant Examiner* — Maliheh Malek
(74) *Attorney, Agent, or Firm* — The H.T. Than Law Group

(57) ABSTRACT

The invention relates to a packaged LED module (1) comprising a module (2) having at least one LED (3) arranged thereon, and a one-piece package (10, 100) having a receptacle for the module (2), a substantially optically transmissive region (11, 11*a*, 11*b*, 11*c*), which makes it possible to emit light from the LED (3) towards the outside, an opening (16) and potting blocking means (17). The package (10, 100) is embodied in such a way that a potting component is introduced via the opening (16) into the package (10, 100) equipped with the module (2). The introduced potting component forms a potting body (30), which completely fills the package (10, 100), excluding a region between the LED (3) and the substantially optically transmissive region (11, 11*a*, 11*b*, 11*c*) on account of the potting blocking means (17), and which connects the package (10, 100), the module (2) and connecting cables (20) that can be connected to the module (2) in an externally sealing manner.

26 Claims, 3 Drawing Sheets

(51) Int. Cl.

| | | |
|---|---|---|
| *F21V 15/01* | (2006.01) | |
| *G02B 6/42* | (2006.01) | |
| *F21S 4/00* | (2016.01) | |
| *F21V 21/002* | (2006.01) | |
| *F21V 27/02* | (2006.01) | |
| *F21V 31/04* | (2006.01) | |
| *H01L 33/48* | (2010.01) | |
| *F21V 29/507* | (2015.01) | |
| *G09F 13/22* | (2006.01) | |
| *F21Y 101/02* | (2006.01) | |

(52) U.S. Cl.
CPC .............. *F21V 21/002* (2013.01); *F21V 27/02* (2013.01); *F21V 29/507* (2015.01); *F21V 31/04* (2013.01); *G02B 6/4255* (2013.01); *H01L 33/48* (2013.01); *F21Y 2101/02* (2013.01); *H01L 2924/0002* (2013.01)

(56) References Cited

U.S. PATENT DOCUMENTS

| | | | |
|---|---|---|---|
| 7,315,698 B2* | 1/2008 | Kuhara et al. ............... 398/202 |
| 8,226,276 B2* | 7/2012 | Pachler et al. ........... 362/311.02 |
| 8,338,851 B2* | 12/2012 | Hwu et al. ..................... 257/99 |
| 8,465,213 B2* | 6/2013 | Tamura et al. ................ 385/92 |
| 8,466,409 B2* | 6/2013 | Ishigami et al. ............. 250/239 |
| 8,766,283 B2* | 7/2014 | Tasch ...................... H01L 33/64 257/81 |
| 8,967,827 B2* | 3/2015 | Urano et al. ............. 362/249.02 |
| 9,022,621 B2* | 5/2015 | Boyer et al. .................. 362/362 |
| 2002/0004336 A1* | 1/2002 | Yamaguchi .................. 439/577 |
| 2002/0190262 A1* | 12/2002 | Nitta et al. ..................... 257/99 |
| 2004/0069998 A1* | 4/2004 | Harazono ....................... 257/81 |
| 2005/0139850 A1* | 6/2005 | Ikeda ............................. 257/99 |
| 2006/0102917 A1* | 5/2006 | Oyama et al. .................. 257/99 |
| 2006/0145180 A1* | 7/2006 | Galli .............................. 257/99 |
| 2006/0197474 A1* | 9/2006 | Olsen ........................... 315/312 |
| 2007/0111344 A1* | 5/2007 | Leising .................. H01L 33/50 438/22 |
| 2008/0029775 A1* | 2/2008 | Liu et al. ........................ 257/98 |
| 2008/0062698 A1* | 3/2008 | Tai et al. ....................... 362/294 |
| 2008/0101063 A1* | 5/2008 | Koike et al. .................. 362/231 |
| 2008/0111145 A1* | 5/2008 | Lin ................................ 257/98 |
| 2008/0123198 A1* | 5/2008 | Fujita .......................... 359/709 |
| 2009/0134408 A1* | 5/2009 | Park et al. ...................... 257/88 |
| 2009/0162957 A1* | 6/2009 | Joung ............................ 438/27 |
| 2009/0195095 A1* | 8/2009 | Yawata et al. .................. 310/71 |
| 2009/0244909 A1* | 10/2009 | Chen ............................ 362/368 |
| 2009/0262531 A1* | 10/2009 | Saha et al. ................... 362/240 |
| 2009/0278153 A1* | 11/2009 | Cho ............................... 257/98 |
| 2009/0302034 A1* | 12/2009 | Makela et al. ................ 220/3.8 |
| 2010/0091504 A1* | 4/2010 | Lee et al. ..................... 362/373 |
| 2010/0109499 A1* | 5/2010 | Vilgiate et al. .................. 313/1 |
| 2010/0163914 A1* | 7/2010 | Urano ............................ 257/98 |
| 2010/0182792 A1* | 7/2010 | Hsiao et al. .................. 362/310 |
| 2010/0277919 A1* | 11/2010 | Okada et al. ............. 362/249.02 |
| 2010/0327723 A1* | 12/2010 | Wang ............................ 313/12 |
| 2011/0031509 A1* | 2/2011 | Kirihara et al. ................ 257/81 |
| 2011/0043135 A1* | 2/2011 | Shim ............................ 315/294 |
| 2011/0044052 A1* | 2/2011 | Yoon .................... H01L 33/486 362/296.04 |
| 2011/0103078 A1* | 5/2011 | Zheng .......................... 362/375 |
| 2011/0209368 A1* | 9/2011 | Quaal et al. .................... 40/550 |
| 2011/0249424 A1* | 10/2011 | Joo et al. ..................... 362/97.1 |
| 2011/0298925 A1* | 12/2011 | Inoue et al. .................. 348/148 |
| 2011/0299816 A1* | 12/2011 | Yen et al. ....................... 385/89 |
| 2011/0317962 A1* | 12/2011 | Malehorn et al. .............. 385/75 |
| 2012/0002407 A1* | 1/2012 | Li et al. ........................ 362/218 |
| 2012/0037927 A1* | 2/2012 | Lai ................................ 257/88 |
| 2012/0193647 A1* | 8/2012 | Andrews ........................ 257/88 |
| 2012/0218760 A1* | 8/2012 | Nagaoka et al. ......... 362/249.02 |
| 2012/0236560 A1* | 9/2012 | Bosch et al. ................. 362/240 |
| 2012/0300456 A1* | 11/2012 | Phillips et al. ............... 362/245 |
| 2013/0039063 A1* | 2/2013 | Quaal et al. .................. 362/235 |
| 2013/0042510 A1* | 2/2013 | Nall et al. ...................... 40/541 |
| 2013/0182434 A1* | 7/2013 | He et al. ...................... 362/237 |
| 2013/0194550 A1* | 8/2013 | Tanigawa et al. ............. 353/30 |
| 2013/0277643 A1* | 10/2013 | Williamson et al. ........... 257/13 |
| 2013/0279160 A1* | 10/2013 | Myers et al. ................. 362/224 |
| 2014/0124824 A1* | 5/2014 | Feng et al. ..................... 257/99 |
| 2014/0367718 A1* | 12/2014 | Park et al. ...................... 257/98 |
| 2015/0131287 A1* | 5/2015 | Marsh et al. ................. 362/260 |

OTHER PUBLICATIONS

Written Opinion of the International Searching Authority; PCT/EP2011/064136.*
International Search Report issued in connection with the corresponding International Application No. PCT/EP2011/064136 on Jan. 30, 2012.
Translated Abstract of DE 199 04 915 to Schauer et al.
Translated Abstract of DE 202009000236 to Ledon Lighting Jennersdorf.

* cited by examiner

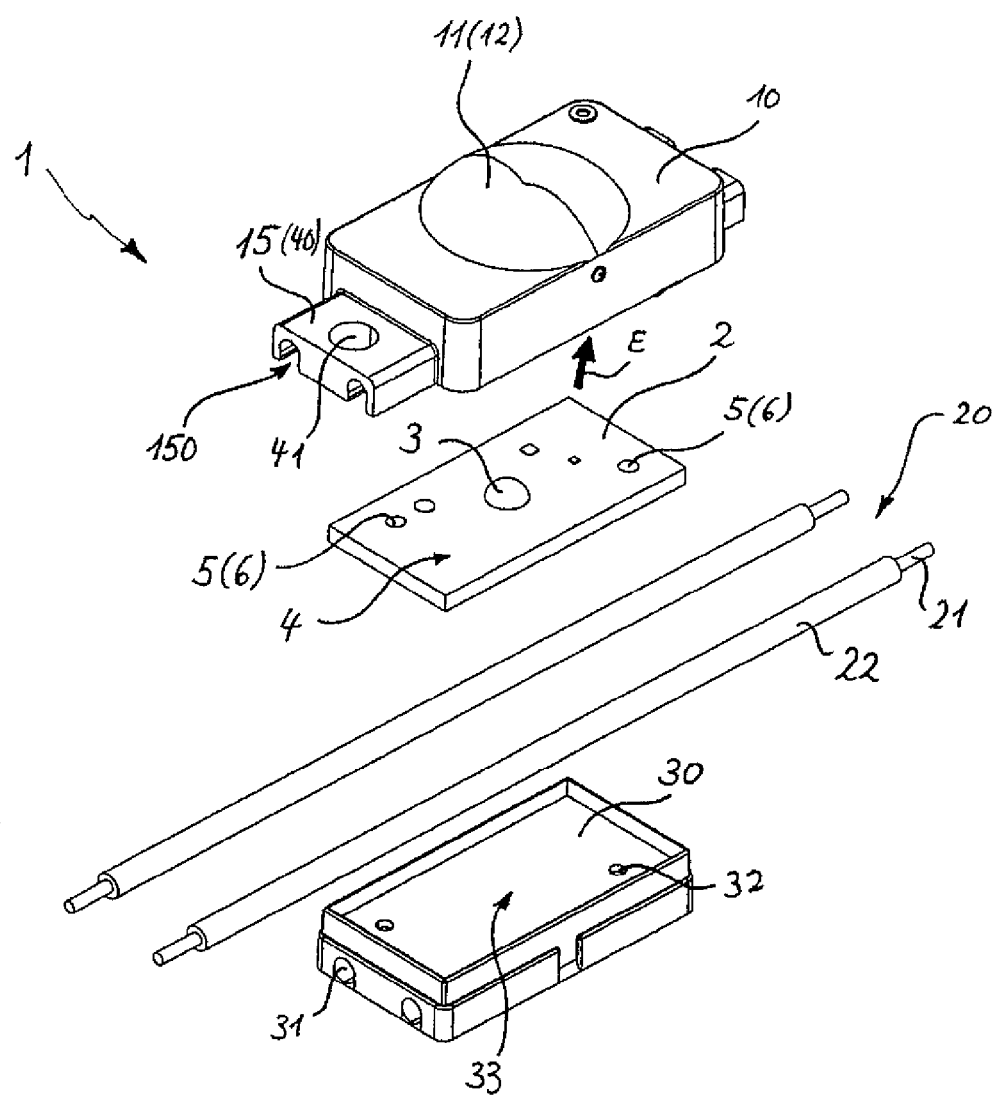

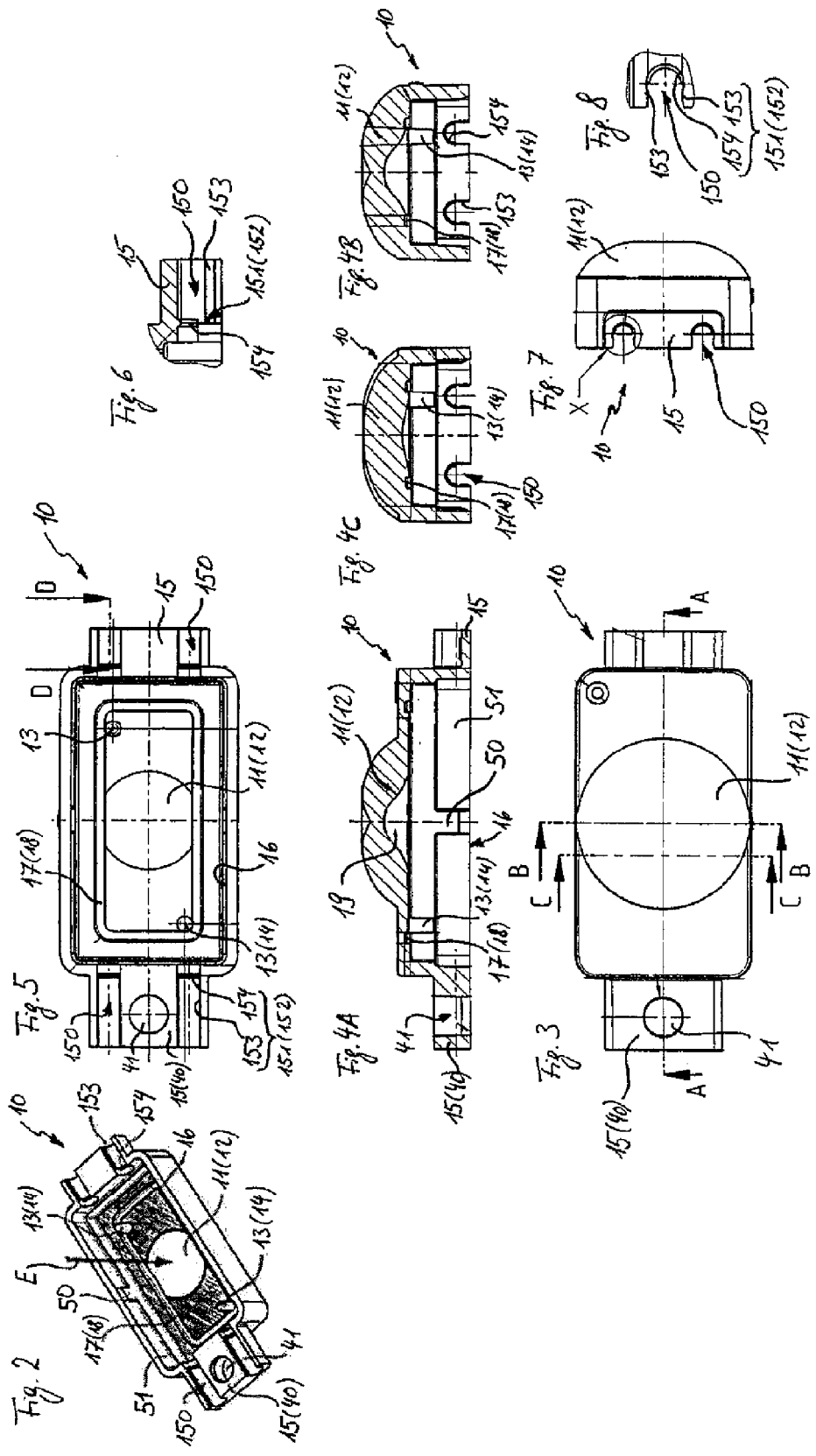

PACKAGED LED MODULE

The present invention relates to a housed LED module for light-emitting diodes (LEDs) with integrated electronics, which enables flexible fitting of the LEDs or the module and which provides corresponding protection from moisture. In addition, the invention relates to a method for producing a housed LED module, a housed LED module system and an LED chain with at least two housed LED modules according to the invention.

BACKGROUND OF THE INVENTION

The prior art discloses LED modules which substantially comprise a module with at least one LED fitted thereon. The individual modules in an LED chain are in this case preferably connected in parallel with one another.

DE 202009013278 discloses a housed LED module with a multi-part housing that can be closed, wherein the housing has, on one end side, at least two rigid conductors protruding out of the wall of the housing, which conductors are designed to make electrical contact with at least two conductors which are supplied substantially at right angles by cutting into the insulation of said at least two conductors, wherein the electrical contact-making can be relieved of strain by means of an additional adapter.

US 2006/0284199 A1 discloses an LED module with a housing, a heat-conducting plate, which can be detachably connected to the housing and closes the housing, a printed circuit board, which can be thermally connected to the heat-conducting plate and has an LED element and a plurality of connecting cables.

DE 20200900236 likewise discloses a housed LED module with a multi-part housing which can be closed and which has lateral connecting guides for at least two connecting cables as strain relief elements which are used for making electrical contact with the module. The housing has lateral cutouts for connecting cables, wherein the connecting guides are two substantially parallel cutouts, which are connected to one another by a connecting chamber. A connection between the connecting chamber and a central recess in which the LED module is mounted is not provided. Correspondingly, the connecting chamber is partitioned by the central recess and therefore also by the LED module. The connecting chamber and the connecting guides can be filled with a liquid and/or curable casting compound via an opening.

However, conventional LED chain modules have a low level of protection against mechanical loading and against moisture and a low degree of flexibility, which restricts their use possibilities.

SUMMARY OF THE INVENTION

Therefore, the aim of the present invention is to provide a housed LED module which enables effective protection against environmental influences on the LED and the module with at the same time a compact and stable design and can be produced easily and quickly. Protection against environmental influences is in this case understood to mean firstly protection against moisture and dust and also protection against mechanical loading of the LED module.

The object is achieved by the features of the independent patent claims. The dependent claims develop the central concept of the invention in an advantageous manner.

In the context of the invention, LED module is understood to mean a carrier or a printed circuit board which comprises at least one LED chip located thereon and the required drive electronics for the at least one LED chip. In this case, the at least one LED chip can be mounted using COB (Chip On Board) or SMD (Surface-Mounted Device) technology, for example.

The present invention concerns a housed LED module having a module with at least one LED arranged thereon, an integral housing with a receptacle for the module, a substantially optically transmissive region, which enables the emission of light from the LED to the outside, and an opening, and a casting blocking means, which is provided or arranged between the module and the housing, wherein the casting blocking means is designed in such a way that it prevents the ingress of a casting compound, (for example by means of a two-component or multi-component injection-molding system) which has been introduced into the housing equipped with the module via the opening, into a region between the LED and the substantially optically transmissive region by eliminating the capillary effect between the module and the housing.

In the context of the invention, LED is used to describe an LED chip. This can be arranged either "face-up" or "face-down" on the module. In addition, an LED casting compound (which should be distinguished from the casting compound introduced into the housing) can be arranged on the module, said LED casting compound surrounding the LED chip. Correspondingly, the LED chip can be encapsulated by the LED casting compound. The LED casting compound preferably consists of liquid plastics and is applied to the module with the aid of a dispensing method. Mechanical protection of the LEDs can be provided instead of the LED casting compound or in addition to this. This mechanical protection can be applied directly to the LED module. For example, so-called globe tops, i.e. LED casting compounds applied by dispensing, which surround the LED can be provided.

The LED casting compound can contain color conversion and/or scattering particles. The LED(s) of the LED module preferably emit(s) light with a wavelength of between 420 and 490 nm. The light is at least partially converted into light with a higher wavelength by the color conversion particles which are contained in the LED casting compound surrounding the LED. The present invention is not restricted to LEDs with a specific wavelength. In the context of the invention, any desired monochromatic LED can be arranged on the LED module. For example, a red-emitting LED which is surrounded by LED casting compound with or without color conversion particles can also be arranged on the LED module. In addition, LEDs which are surrounded with LED casting compounds with different color conversion particles can be arranged on the LED module.

The LED casting compound is preferably applied to the LED chip in the form of a dome or a hemisphere.

However, it is also possible for color conversion means to be arranged separately in the housing of the module. Correspondingly, an LED casting compound with color conversion means can be arranged spatially separate from the LED chip.

The control electronics of the LED chip are preferably fitted to the reverse of the module. Alternatively, however, they can also be fitted to the same surface as the LED chip of the module. They can also be located at least partially within the carrier or the printed circuit board of the module. The control electronics of the module in this case preferably comprise a transistor circuit or further electronics and an interface for a communications device or a communications bus. Furthermore, they can have an integrated circuit, preferably an ASIC (application-specific integrated circuit). In addition, it is conceivable for them to have a sensor system, such as, for example, a temperature, brightness or color sensor, for monitoring the LED module.

According to the invention, the housing of the LED module is formed integrally and has an opening. Preferably, the housed LED module is designed to be open at least towards one side or on one side, wherein both the casting compound can be introduced into the housing and the LED module can be inserted into the housing easily via this opening in the housing.

According to the invention, the housing is designed in such a way that, once the LED module has been inserted into the receptacle, the housing can be filled with casting compound immediately from the rear, i.e. via the opening. The casting blocking means achieve in particular an interruption or elimination of the capillary effect between the module inserted into the housing and the housing, with the result that the introduced casting compound does not enter the region between the LED and the substantially optically transmissive region owing to the capillary effect. Therefore, targeted emission of light from the LED towards the outside is furthermore enabled. The use of the casting blocking means makes it possible in a particularly simple manner for the LED module and also connecting cables that can be connected to the module to be sealed off from the outside and fully cast in the housing without the use of an additional material, such as a separate sealing element, for example, without the casting compound penetrating forwards between the LED and the substantially optically transmissive region. It is also possible to dispense with additional separating walls or the like which would result in an enlargement of the entire component part.

Since the housed LED module can be fully cast, no additional lower part is also required for sealing the housing, whether it be an additional cover or a cover formed integrally with the housing, for example a pivotable cover.

Since the housing with the module can be filled with casting compound directly after the module is inserted, it is also possible to dispense with the use of a double-sided adhesive mounting tape for the module for fixing said module.

Since the cast body surrounds both the connecting cables and the connection between the connecting cables and the LED module, in this way safe strain relief is likewise provided for the connecting cables. Tensile forces acting on the cables are thus safely conducted into the cast body and therefore into the housing. Consequently, both the production and installation steps are reduced and the production costs are also reduced using the apparatus according to the invention, wherein, at the same time, effective protection against environmental influences on the LED and the LED module is enabled given, at the same time, a compact and stable design.

The LED module is constructed in this way such that it converts more than 60% of the operating voltage for light generation. For example, when using 3 LEDs in a series circuit with 12V, said LEDs have a forward voltage of approximately 10-11V in the case of the operating current. By virtue of this interconnection, 83-91% of the electrical power is therefore converted for light generation, as a result of which an optimum luminous efficacy (1 m/W) can be achieved.

Advantageously, the introduced casting compound (after curing) forms a cast body, which completely fills the housing, apart from the region between the LED and the substantially optically transmissive region, owing to the casting blocking means, and which connects the housing, the module and connecting cables which can be connected to the module in outwardly sealing fashion. The integral housing with the module and connecting cables which can be connected to the module can therefore be filled with casting compound completely and the module and the connecting cable regions correspondingly arranged in the housing can therefore be integrated in the housing in outwardly sealing fashion in a manner safe from environmental influences, wherein casting blocking means nevertheless prevent only one region between the LED and the substantially optically transmissive region from being filled with casting compound.

Preferably, the casting blocking means are an integral part of the module and/or the housing. Particularly preferably, the casting blocking means have a groove, which is formed in the inner side of the housing and around the substantially optically transmissive region. In this way, the region between the LED and the substantially optically transmissive region of the housing is not filled with casting compound since the capillary effect between the housing and the module is interrupted or eliminated by the groove and the casting compound cannot enter this region. The casting compound introduced into the housing with the module through the opening consequently spreads out throughout the housing, but does not enter the region between the LED and the substantially optically transmissive region of the housing since an inflow into this region is interrupted owing to the peripheral groove and consequently the elimination of the capillary effect. Thus, the ingress of casting compound into the emission region of the LED is prevented by particularly simple means and with little outlay in terms of material and work.

Preferably, the module rests flat on that side of the housing which has the groove. For this purpose, both the module and the corresponding side of the housing are preferably flat. In this way, the ingress of the casting compound into said region between the LED and the substantially optically transmissive region can be prevented even more effectively.

Preferably, the housing or the substantially optically transmissive region has a plurality of substantially optically transmissive regions. In this case, the groove can be formed around the entirety of the substantially optically transmissive regions. As an alternative, the respective substantially optically transmissive regions, either individually or in groups, are each provided with a dedicated, independent casting blocking means, which is formed in the form of a peripheral groove, for example, in each case around one or a corresponding group of substantially optically transmissive regions.

Preferably, the substantially optically transmissive regions are provided in a linear arrangement or at least one of the substantially optically transmissive regions can be provided so as to be offset with respect to at least one other substantially optically transmissive region.

Preferably, the housing also has positioning means as receptacle for the module, which positioning means interact with positioning means of the module in such a way that they fasten and/or center the module in the housing. For this purpose, the positioning means of the housing has at least one locating pin, which extends into the housing counter to the plug-in direction of the module, and the module is plugged onto the locating pins via corresponding locating openings as positioning means. In this way, the module can be centered easily in the housing and the positioning means can at the same time be used for fastening the module in the housing, with the result that said module is arranged securely and fixed in position until the casting compound is introduced.

In order to produce a force-fitting and form-fitting connection between the housing and the module and in order to improve and ensure the fixing of the position of the module, the positioning means of the housing, i.e. for example the locating pins, with the plugged-on module can be caulked. The module arranged in the housing is thus safely prevented from becoming detached from its predetermined position.

As an alternative or in addition, the positioning means of the housing, for example the abovementioned locating pins, can provide an electrical connection between the module and at least one, preferably at least two, connecting cables used for making electrical contact with the module. For this purpose, the positioning means preferably have an electrically conductive surface or are produced from an electrically conductive material. Those regions of the locating openings in the module which are in contact with the positioning means likewise have electrically conductive connections for this purpose. In order to enable contact with the connecting cable(s), either the locating pins have insulation displacement contacts at their end facing the connecting cables or the insulation is stripped from the connecting cables at corresponding points, with the result that an electrical connection is produced simply by virtue of touching contact. This connection is finally fixed in position by the cast body, which fills the housing and connects the housing in sealing fashion to the module and connecting cables.

Preferably, the housing also has lateral connecting guides with recesses, in which at least one, preferably at least two, connecting cables used for making electrical contact with the module are guided. The recesses preferably have tapers, which sectionally reduce the diameter of the recess. Particularly preferably, the tapers are in the form of sealing lips of the recesses, into which the connecting cable(s) is/are pressed in order to fix the connecting cable(s) in sealing fashion in the connecting guides. An additional sealing element can therefore be dispensed with. The cast body on its own and also supported by the sealing lips therefore makes it possible for the LED module to be mounted in sealing fashion and in securely fixed fashion in the housing without the use of additional material. In addition, the tapers act as additional strain relief, with the result that the tensile forces acting on the connecting cable(s) can be transferred safely to the housing.

In addition, the module can have contact-making elements for making electrical contact between the module and the connecting cables, for example on that side of the module which is remote from the LED. This is particularly the case when the locating pins are not being used for making electrical contact between the module and the connecting cables. For this purpose, the contact-making element is preferably electrically conductive and can consist of a metal or a metal alloy. The contact-making elements are preferably in the form of insulation displacement contacts, piercing contacts, crimping contacts or similar known contact-making elements. Insulation displacement contacts are generally formed in such a way that they have a slot into which the corresponding conductor is inserted. The slot has a size such that, during the insertion, the insulation of the line is cut through. Thus, electrical contact with the line can be realized. In this case, the slot preferably has such a width that the conductor, for example a wire or litz wire, is not cut. Thus, an electrical connecting or plug-type contact can be produced simply by plugging together or plugging on the connecting cables.

Particularly preferably, the casting compound has a material with a high thermal conductivity, such as polyurethane, silicone resin, epoxy resin or similar known materials, for example. Preferably, the casting compound comprises a material with high thermal conductivity, wherein the thermal conductivity is preferably higher than 0.3 W/(m*K), particularly preferably higher than 0.5 W/(m*K). Such casting materials make it possible for the temperature of the LED within the housing to be kept within predetermined limits despite small geometric dimensions of the housing, as a result of which the life of the housed LED module can be set optimally. In particular with the abovementioned materials as casting compound, a material is thus provided which offers good resistance to UV radiation, has a relatively high thermal conductivity and has a short processing time for the casting of the housing with the module. The abovementioned resins and other casting compounds can be introduced or injected, for example, by means of a two-component or multi-component injection-molding system.

In addition, the invention comprises a method for producing a housed LED module, a housed LED module system, and an LED chain with at least two of the housed LED modules according to the invention mounted on connecting cables, preferably flexible connecting cables.

BRIEF DESCRIPTION OF THE DRAWING

An exemplary embodiment of the LED module according to the invention will be described below with reference to the drawings of the attached figures, in which:

FIG. 1 shows an exploded drawing of a first exemplary embodiment of the LED module according to the invention FIG. 2 shows a perspective view from below of the housing of the LED module shown in FIG. 1.

FIG. 3 shows a plan view of the housing shown in FIG. 1.

FIG. 4A shows a sectional view of the housing through the line A-A in FIG. 3.

FIG. 4B shows a sectional view of the housing through the line B-B in FIG. 3.

FIG. 4C shows a sectional view of the housing through a line C-C in FIG. 3.

FIG. 5 shows a view from below of the housing shown in FIG. 1.

FIG. 6 shows a partial sectional view of the housing through the line D-D in FIG. 5.

FIG. 7 shows a side view of the housing shown in FIG. 1.

FIG. 8 shows a detail view of the detail X of the housing shown in FIG. 7.

DETAIL DESCRIPTION OF THE INVENTION

Figure 9:
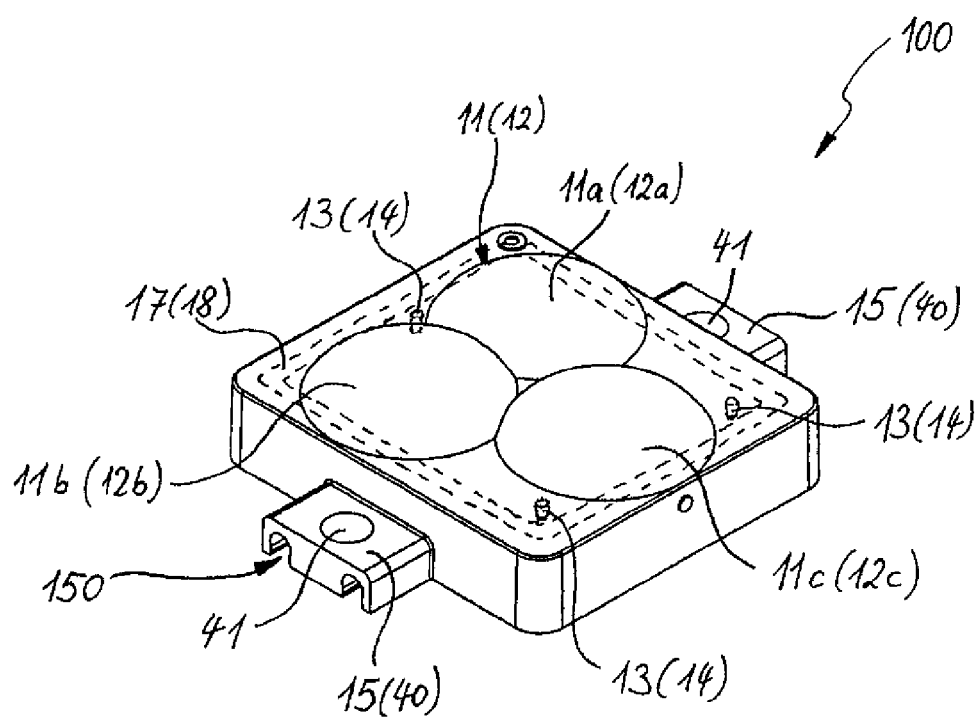
FIG. 9 shows a perspective view of a housing according to the invention in accordance with a second exemplary embodiment.

FIG. 1 shows a housed LED module 1 according to the invention in accordance with a preferred embodiment in an exploded view. The housed LED module 1 according to the invention comprises an LED module 2, also referred to below as module, on which at least one LED 3 is applied or arranged. However, any desired number of LEDs 3, for example three LEDs 3, is possible. The LEDs 3 are then preferably connected in parallel. The module 2 also has a transistor circuit or further switching controllers and an interface for a communications device. The surface 4 of the module 2 on which the LED 3 is located is preferably reflective. For this purpose, for example, white paint or varnish can be applied to the module 2. It is also possible to apply a reflective coating, for example a prefabricated film, to the module 2. The module 2 is preferably a flat module. The electronics for the module 2 are preferably only applied on one surface of the module 2. Preferably, the electronics are applied to the module 2 on the same side as the LED chip.

The LED chips can be applied face-up or face-down on the module 2. In this case, the LED chips can be surrounded by a hemispherical or dome-shaped LED casting compound which may contain color conversion particles. The color conversion layer is in this case preferably applied to the LED chips in the liquid state with the aid of a dispensing operation.

Instead of the LED casting compound or in addition to this, a mechanical protection, for example a so-called globe top, can be arranged over each of the LED chips. The globe top preferably consists of transparent plastics.

The LEDs 3 can comprise any type of monochromatic LED chips or LEDs converted by color conversion means or phosphor. In particular, blue-converted or red-converted LEDs can be arranged on the LED module 2.

The color conversion particles of the LEDs 3 in this case convert the light emitted by the LED chip at least partially into light with a higher wavelength. Preferably white light is generated by additive color mixing by the light rays emitted by the LED chip and the color conversion particles.

The housed LED module 1 also has an integral housing 10. Preferably, the housing 10 is completely or at least partially open on at least one side in order to enable simple and safe insertion of the module 2 into a receptacle of the housing 10. Then, the housing 10 is an integral, open housing. The housing 10 is preferably manufactured from plastics with the aid of an injection-molding process.

The housing 10 has a substantially optically transmissive region 11, which enables the emission of light from the LED 3 to the outside. In accordance with the exemplary embodiment, the housing 10 is transparent at least in the region of the LED 3. In one embodiment, the entire housing 10 can be transparent. Preferably, however, only the region above the at least one LED 3 is transparent, while the other regions of the housing 10 are opaque owing to a different choice of material, owing to surface treatment (roughening etc) or else owing to varnishing. Therefore, the electronics on the module 2 can be made such that they are not internally visible from above. The substantially optically transmissive region 11 can preferably be in the form of a lens 12 or plastic lens, in particular such that the region of the at least one LED 3 above the surface contour of the housing 10 bulges outwards, as can be seen in FIGS. 4A-4C and 7, for example. The optically transmissive region 11 is preferably arranged coaxially to the LED 3. The lens 12 can in this case have a scattering and/or diffracting function.

Preferably, the substantially optically transmissive region 11 can have a function whereby it changes the light beam characteristic of the LED 3. In a preferred embodiment, the optically transmissive region 11 has a scattering effect, a reflector effect and/or a color conversion effect, which changes the light emission characteristic of the LED 3. For example, the optically transmissive region 11 is structured at least on its outer surface and/or inner surface and therefore has a diffusing effect.

The module 2 also comprises positioning means 5, which enable correct positioning, i.e. centering and fastening, of the module 2 within the housing 10. The positioning means 5 preferably interact with positioning means 13 of the housing 10 as a receptacle for the module 2 (cf. FIG. 2) in such a way that they fasten and/or center the module 2 securely in the housing 10. Thus, the module 2 is prevented from shifting in the interior of the housing 10.

In a preferred embodiment, the positioning means 13 are integrally extruded on the housing 10 and engage in recesses or depressions in the module 2. For this purpose, the positioning means 13 preferably comprise at least one locating pin 14, for example a mandrel or journal, which extends or protrudes into the housing 10 and counter to the plug-in direction E of the module 2 and is guided or plugged on and preferably held in a corresponding locating opening 6 or cutout as positioning means 5 of the module 2. The locating pins 13 in this case preferably differ from one another in terms of shape and/or size, with the result that the module 2 can be positioned in the housing 10 without any mistakes being made. Correspondingly, the locating opening 6 for this purpose can have a corresponding special shape, for example a rectangular or triangular shape, or size. When the positioning means 5, 13 are therefore in the form of mutually corresponding, profiled elements, the module 2 can be laid into the housing 10 in a defined manner and with the correct orientation and precise and correct positioning of the module 2 within the housing 10 is thus enabled. Therefore, errors on insertion of the module 2 into the housing 10 can be avoided. The positioning means 5, 13 are arranged on diametrically opposite sides of the housing 10, for example.

In a preferred embodiment, the positioning means 13 of the housing 10 can be caulked for example mechanically or by means of ultrasound once the module 2 has been plugged on correspondingly. In this way, a force-fitting and form-fitting connection between the housing 10 and the module 2 can be produced safely, with the result that the module 2 is already held prior to casting, which will be described in more detail further below.

In addition, the housing 10 preferably has lateral connecting guides 15 for at least one, preferably at least two, connecting cables 20 used for making electrical contact with the module 2, which connecting cables are guided in the connecting guides 15. Where connecting cables 20 is referred to in the plural in the text which follows for reasons of simplicity, this is alternatively intended to mean both a single connecting cable and a plurality of connecting cables; the same applies to the reverse case where the connecting cable 20 is referred to in the singular. In accordance with the invention, therefore, one or more connecting cables are always included in all the exemplary embodiments. In order to produce an electrical connection between the module 2 and the connecting cable 20, the module 20 preferably has contact-making elements (not shown) for making electrical contact between the module 2 and the connecting cable 20 on that side of the module which is remote from the LED 3. However, the arrangement of the contact-making elements is not restricted by the invention. In a preferred embodiment, the contact-making elements include insulation displacement contacts, with the result that electrical contact can be made between the connecting cables 20 and the module 2 simply by means of a plug-on process prior to and after introduction of the module into the housing 10. In general, insulation displacement contacts are designed in such a way that they have a slot, into which the corresponding conductor 21 is inserted. The slot has such a size that, during the insertion, the insulation 22 of the line 20 is cut through. Thus, electrical contact with the line 20 can be realized. In this case, the slot preferably has such a width that the conductor 21, for example a wire or litz wire, is not cut, but a clamping contact is provided between the insulation displacement contact and the conductor 21, with the result that the connecting cable 20 is held securely in the contact-making element. In addition to insulation displacement contacts, other known types of contacts can also be provided, such as piercing contacts or crimping contacts, for example.

Instead of the contact-making elements (for example insulation displacement elements) on the module 2, an electrical connection between the module 2 and the connecting cable 20 can also be achieved by means of contact-making elements on the housing 10, i.e. preferably by means of the positioning elements 13 of the housing 10. For this purpose, the positioning elements 13, preferably in the form of positioning pin 14, are coated with an electrically conductive layer, for example, or produced as separate parts from an electrically conductive material and fastened at the corresponding position on the housing 10. An electrical contact with the module 2 can then be produced in such a way that corresponding electrical contact regions or contacts are provided at the contact regions between the locating pin 14 and the locating opening 6 of the module 2, for example in the locating openings 6. The electrical contact with the connecting cables 20 can be produced in such a way that either the locating pin 14 has contact-making elements (for example insulation displacement elements or the like), for example at those ends of said locating pin which face the connecting cables 20, with it being possible for the connecting cables 20 to simply be plugged onto said contact-making elements, or alternatively the insulation can be stripped off from the connecting cables 20 at the corresponding points and said connecting cables can be brought into contact with the ends of the locating pin 14 before a casting compound is introduced into the housing 10, which will be described in more detail below.

As has previously been described, the housing 10 has one or preferably more lateral connecting guides 15, via which the connecting cables 20 are guided out of the housing 10. With particular reference to FIGS. 5 to 8, the connecting guides 15 will be described in more detail below.

The connecting guides 15 are preferably formed integrally with the housing 10, preferably injection-molded together with said housing in an injection-molding process.

In order to receive and guide the connecting cables 20, the connecting guide 15 has in each case at least one connecting cable recess 150, also referred to below as recesses. The recesses 150 preferably have tapers 151, which sectionally reduce the diameter of the recess 150. These protruding sections, i.e. the tapers 151, enable a clamping connection between the connecting cables 20 and the recesses 150 in the assembled state with the housing 10. Preferably, at least one taper 151 is provided in each of the preferably semicircular recesses 150. However, it is also possible for a plurality of tapers 151 to be provided in each of the preferably semicircular recesses 150. These tapers 151 form sealing lips 152, which safely seal off the cables at their touching-contact faces. In order to ensure that the connecting cables 20 are pressed safely into the recesses 150, the tapers 151 extend both along the recess 150 in the form of a longitudinal taper 153 and along their semicircular surface contour in the form of a contoured taper 154.

In this way, the connecting cables 20 can be pressed into the sealing lips 152 of the recesses 150 in order to fix the connecting cables 20 securely in sealing fashion in the connecting guides 15.

In addition, the housing 10 has an opening 16, which is positioned in such a way that, in the assembled state of the housing 10 with the module 2 and the connecting cables 20 connected thereto, access to the interior of the housing 10 is enabled. In the assembled state, an injection-molding material or a casting compound (for example by means of a two-component or multi-component injection-molding system) can be introduced into the housing 10 equipped with the module 20 via the opening 16. Preferably, the housing 10 is at least partially open at least on one side. In accordance with the exemplary embodiment shown in the figures (cf. FIGS. 2, 4A and 5, for example), the housing 10 has five side walls defining the interior of the housing 10, while one side is completely open. This open side forms the opening 16, via which the housing 10 with the module 2 and connecting cables 20 can be filled with casting compound from the rear. Preferably, the module 2 can also be inserted into the housing 10 via this opening. However, it is also conceivable for different openings to be provided for inserting the module 2 and for introducing the casting compound and/or for the opening 16 to be formed in another side and/or only in a region of a side wall, for example as a hole or slot.

In particular the opening 16 for introducing the casting compound and possibly also the opening for introducing the module 2 into the housing 10 are preferably provided in the housing 10 on a side of the housing 10 which is opposite the substantially optically transmissive region 11. In this way, the casting compound can, during filling of the housing 10, which will be described in more detail below, be pushed by the introduced casting material from the rear into its position and safely onto the housing 10.

Examples of casting compounds which can be used are liquid plastics or epoxy material. Particularly preferably, a material with a high thermal conductivity is used, wherein the thermal conductivity is preferably higher than 0.3 W/(m*K), particularly preferably higher than 0.5 W/(m*K). Particularly preferably, polyurethane, silicone resin, epoxy resin or other known materials with preferably high thermal conductivity are used as casting compound. When the casting compound is introduced into the assembled housing 10 via the opening 16, the introduced casting compound is distributed in the housing 10, which is therefore filled with casting compound. Both the module 2 and the connecting cables 20 which have been inserted into the housing 10 are correspondingly surrounded by the introduced casting compound. By virtue of the introduced material drying or curing, the casting compound produces a cast body 30 (cf. FIG. 1) and consequently a form-fitting connection between the housing 10, the module 2 and the connecting cables 20 of the module 2 with the cast body 30. In this way, the interior of the housing 10 is protected safely and in sealing fashion from environmental influences such as moisture, for example, both by means of the cast body 30 and by means of the sealing lips 152.

In addition, it is possible to dispense with additional parts for closing the housing 10 and for providing or attaching the module 2 in the housing 10.

Furthermore, in addition to the tapers 151 of the recesses 150 of the connecting guides 15, the cast body 30 formed from the casting compound also safely acts as strain relief for the connecting cables 20 since said cast body surrounds the connecting cables 20 safely and fixedly. Thus, the tensile forces acting on the connecting cables 20 are transferred better both to the housing 10 and to the cast body 30, which increases the mechanical resistance of the LED module 2 and the entire housed LED module 1. Drying or curing of the applied material consequently enables sealing of the single, integral, open housing 10. Since, therefore, all of the openings are sealed off safely, the housing 10 of the housed LED module 1 is protected against environmental influences such as dust, dirt and moisture. Owing to the embodiment of the housing 10 according to the invention, protection against dust and moisture is consequently achieved in accordance with the standard IP67. In addition, it is possible to dispense with additional parts or parts which are formed integrally and movably with the housing, such as a cover for closing the housing, for example.

The strain relief of the connecting cables 20 also enables the formation of a resistance chain of a plurality of LED modules according to the invention to form an LED chain.

According to the invention, the housed LED module 1 has casting blocking means 17, which are provided or arranged between the module 2 and the housing 10. In this case, the casting blocking means 17 can be an integral part of the module 2 and/or the housing 10. As can be gleaned in particular from the preferred embodiment shown in FIGS. 2 and 5, the housing 10 has the casting blocking means 17. However, in accordance with another embodiment, it is also possible for the casting blocking means 17 to be provided at a corresponding position on the module 2 or else separately from the housing 10 and/or module 2 between said housing and module. In accordance with yet another embodiment, it is also possible for casting blocking means 17 to be provided in each case both on the housing 10 and on the module 2, wherein said casting blocking means can correspond to one another or can be formed spatially separate from one another. It is also conceivable for more than one casting blocking means 17 to be provided on the housing 10 or the module 2.

The casting blocking means 17 are formed in such a way that they interrupt a capillary effect between the module 2 and the housing 10. For this purpose, these casting blocking means 17 preferably have a groove 18, which is preferably formed in the inner side of the housing 10 and around the substantially optically transmissive region 11. In this case, the casting blocking means 17 in particular forms a peripheral groove 18. If more than one casting blocking means 17 is provided, said casting blocking means are each formed around the substantially optically transmissive region 11 and around the respective other casting blocking means 17, preferably concentrically around one another. The casting blocking means 17 is/are preferably arranged coaxially around the substantially optically transmissive region 11 and possibly also around one another, wherein the axis of symmetry is preferably in the center of the substantially optically transmissive region 11 or the housing 10.

By virtue of this casting blocking means 17, the capillary effect between the module 2 and the housing 10 is interrupted in this region when the casting compound is introduced via the opening 16 and the casting compound therefore does not spread out in a region 19 between the LED 3 and the substantially optically transmissive region 11. In this case, therefore, the region 19 corresponds to a light emission region of the LED module 1. Advantageously, for this purpose the module 2 rests flat on the inner side of the housing 10. As a result, the interior of the housing 10, apart from the region 19 between the LED 3 and the substantially optical transmissive region 11, is completely filled with casting compound, wherein no casting material enters precisely in the abovementioned region 19. In this way, it is possible to dispense with additional separating walls and, as a result, an enlargement of the housing 10 per se, with the result that the housed LED module 1 can overall be designed to be smaller. Furthermore, the housing 10 can be filled with casting material directly after insertion of the module 2 immediately from the rear. The use of the groove 18 for the module 2 and the sealing lips 152 for the connecting cables 20 therefore have the advantage that the housing can be fully cast without the use of further materials, wherein ingress into the region 19 is safely avoided. Since the module 2 can be fully cast, it is also possible to dispense with an additional lower part for mounting a double-sided adhesive mounting tape for the module 2.

If the opening 16 for introducing the casting compound is provided in the housing on that side of the housing 10 which is opposite the substantially optically transmissive region 11, the module 2, in particular in the case of a flat design thereof and of the corresponding housing side, can be pressed in the plug-in direction E of the module 2 and consequently onto the housing 10 when the casting compound is introduced. Therefore, the module 2 is pressed onto that side of the housing 10 on which the substantially optically transmissive region 11 and the casting blocking means 17 are provided. Therefore, since the module 2 is pressed against the above mentioned side of the housing 10, the ingress of casting compound into the region between the LED 3 and the substantially optically transmissive region 11 is additionally suppressed or made more difficult, in addition to the effect of the casting blocking means 17 for interrupting the capillary effect between the module 2 and the housing 10. In addition, additional fastening of the module on the housing 10 and prior to the filling with casting compound can also be dispensed with, with the result that the housing 10 can be filled with casting material from the rear safely, quickly and easily directly after the module 2 with connecting cables 20 has been inserted.

If polyurethane is preferably used as casting compound, the housed LED module 1 can overall be particularly small since the polyurethane has a particularly high thermal conductivity, which enables good thermal dissipation from the LED 3 or the module 2, as a result of which the geometric dimensions of the housing 10 can be kept particularly small, while nevertheless a temperature range which is safe for the module 2 can be maintained. In addition, the polyurethane has good resistance to UV radiation and furthermore enables a relatively short processing time during the casting operation.

The cast body 30 formed from the casting compound consequently connects the housing 10, the module 2 and connecting cables 20 connected to the module 2 in outwardly sealing and positionally fixed fashion, as a result of which a compact, stable housed LED module 1 which is safely sealed off from and protected from environmental influences is provided without any additional component parts and in a particularly simple manner. FIG. 1 illustrates the cast body 30. It can clearly be seen from said figure that the cast body 30 is an image of the cavity of the interior of the housing 10 with the module 2 and connecting cables 20 inserted. Thus, for example, the regions 31 surrounding the connecting cables 20 and the regions 32 through which the locating pins extend are shown. It can likewise be seen that no casting material is provided in a region 33 corresponding to the region 19. This can be attributed to the casting blocking means 17, which have prevented the ingress of casting compound by suppressing the capillary effect between the module 2 and the housing 10, with the result that no casting compound is present in the region 19 between the LED 3 and the substantially optically transmissive region 11.

As can be seen from FIG. 2 and FIG. 4A, the housing 10 has a profiled surface. As shown in the figures, this profiled surface can be achieved by means of webs 50 or cutouts 51, for example. The profiles can be formed in such a way that the cast body 30 is either connected nondetachably to the housing 10 after curing, for example by the provision of undercuts in the housing 10, or it is conceivable for the cast body 30 to be held firstly securely in the housing 10 owing to the profile and an associated enlargement of the surface area, as a result of the configuration of the profile, for example by means of bevels, but the cast body 30 can be detached from the housing again relatively easily.

As can be seen in particular in FIGS. 1, 3 and 5, the housing 10 also preferably has fastening shoulders 40, which are advantageously cast onto the housing 10 with the aid of the injection-molding process. The fastening shoulders 40 have a central bore 41, which enables fastening of the housing 10 with the aid of screws on external surfaces. Particularly preferably, the fastening shoulder 40 corresponds to the connecting guide 15, as a result of which the housing 10 can be even more compact. In this case, the bore 41 preferably extends between the recesses 150 through the connecting guide 15, but at least in such a way that it does not intersect the recesses 150.

FIG. 9 shows a further embodiment of a housed LED module according to the invention, to be more precise a housing 100 according to the invention. The housed LED module according to the invention in accordance with the second embodiment in this case includes all of the features in accordance with the first exemplary embodiment, with the result that reference is made entirely to the above statements so as to avoid repetition. Identical reference symbols in this case correspond to identical features. In the text which follows, the essential differences in relation to the first exemplary embodiment will now be illustrated.

It has already been mentioned that any desired number of LEDs can be applied to or arranged on an LED module. FIG. 9 now shows an exemplary embodiment of an integral, open housing 100 of a housed LED module according to the invention which is designed for an LED module with three LEDs. However, as has already been mentioned, the invention is not restricted to this number. Preferably, the housing 100 or the substantially optically transmissive region 11 of the housing 100 has a number of substantially optically transmissive (sub) regions 11a, 11b, 11c which likewise corresponds to the provided number of LEDs, said (sub)regions particularly preferably being in the form of lenses 12a, 12b, 12c or plastic lens, in particular such that the region of the respective LED curves outwards over the surface contour of the housing 100. The respective optically transmissive region 11a, 11b, 11c is preferably arranged coaxially to the corresponding LED.

In accordance with one configuration, the substantially optically transmissive regions 11a, 11b, 11c can be provided in a linear arrangement, preferably along the connecting cables 20 guided in the connecting guides 15. However, as can also be seen from the exemplary embodiment shown in FIG. 9, in the case of a plurality of substantially optically transmissive regions 11a, 11b, 11c, at least one can also be arranged so as to be laterally offset with respect to the others. This offset can be formed (in terms of direction, dimension, etc) as desired. As shown in FIG. 9, for example, two light spots or substantially optically transmissive regions 11a, 11b are arranged offset with respect to a third light spot or substantially optically transmissive region 11c, with the result that the three substantially optically transmissive regions 11a, 11b, 11c have a triangular form on the housing 100.

However, the invention is not restricted either to the number of substantially optically transmissive regions 11a, 11b, 11c or to the size thereof or arrangement thereof with respect to one another.

Furthermore, it is conceivable, for example, for a differently colored LED to be associated with each substantially optically transmissive region 11a, 11b, 11c and/or for the substantially optically transmissive regions 11a, 11b, 11c to have different functions in respect of scattering effect, reflector effect and/or color conversion effect, which changes the light emission characteristic of the associated LED correspondingly.

It is also conceivable for a plurality of LEDs of the same or different colors to be associated with a substantially optically transmissive region 11a, 11b, 11c. This applies in the same way to the first exemplary embodiment.

As can be seen from FIG. 9, the housing 100 also has casting blocking means 17 for interrupting a capillary effect between the module and the housing 100, which casting blocking means preferably have a groove 18 which is also preferably formed in the inner side of the housing 100 and around the entirety of the substantially optically transmissive region 11a, 11b, 11c. Thus, the casting compound does not spread out in a light emission region between the LEDs and the substantially optically transmissive regions 11a, 11b, 11c. As a development of this shown exemplary embodiment, it is also conceivable for the respective substantially optically transmissive regions 11a, 11b, 11c to be provided, individually or in groups, in each case with a dedicated, independent casting blocking means 17, which, for example in the form of a peripheral groove 18, surrounds in each case one or a corresponding group of substantially optically transmissive regions 11a, 11b, 11c in the above described way.

Likewise, the housing 100 of the exemplary embodiment shown in FIG. 9 also has positioning means 13, which interact with corresponding positioning means of the module in the manner already described above. The positioning means 13 can, as illustrated, be in the form of locating pins 14, whereas the positioning means of the module can be provided as locating openings or cutouts. In the example shown, three locating pins 14 are provided, which are arranged in mirror-inverted fashion with respect to the substantially optically transmissive regions 11a, 11b, 11c in a triangular form and are thus preferably provided in regions in which there are no substantially optically transmissive regions 11a, 11b, 11c. The number and position of the positioning means 5, 13 or locating openings 6 and locating pins 14 is, however, not restricted by the invention and can therefore be provided as desired depending on the size and geometry of the housing and the housed LED module.

Preferably, according to the invention, an LED chain can be formed by virtue of a plurality of housed LED modules 1 according to the invention simply being arranged and mounted on the connecting cables 20 at any desired positions. The connecting cables 20 between the housed LED modules 1 are lines without any interruption with which contact can be made at the contact points either by virtue of insulation stripping or using insulation displacement contacts, without interrupting the continuous cable. This solution enables the formation of a continuous chain and the use of preprogrammable module spacings, which are variable as desired, within the LED chain as well. By virtue of the use of flexible connecting cables 20, the range of uses can be increased further in comparison with rigid conductors. Thus, an infinite number of possible spacings (uniform; nonuniform; repetitive) of the LED modules 1 according to the invention on a connecting cable 20 is provided, with it being possible for said modules to be produced in a simple manner by casting of the cast body. It is likewise possible owing to the possible use of continuous cables to have any desired chain length, which can also assume any desired form in the case of flexible connecting cables.

A method for producing a housed LED module 1 is described below.

In a first step, a module 2 with at least one LED 3 arranged thereon is introduced into a receptacle of an integral housing 10, 100, which is preferably open on at least one side. The housing 10, 100 in this case has the substantially optically transmissive region 11, 11a, 11b, 11c and the opening 16. The module 2 can be inserted into the housing 10, 100 or the receptacle thereof either via the opening 16 or a separate opening. The receptacle of the housing 10, 100 can in this case, as described above, be formed by corresponding positioning means 5, 13 of the module 2 and the housing 10, 100, which interact correspondingly, wherein for example the positioning means 13 of the housing 10, 100 can be in the form of a locating pin 14, which is plugged into locating openings 6 in the module 2 in order to fasten and/or center the module 2 in the housing 10, 100. By virtue of a profiled configuration of the positioning means 5, 13, a specific alignment of the module 2 can be ensured. In addition, profile elements can be provided in the housing 10, 100, which profile elements likewise ensure precise positioning and displacement-free mounting of the module 2 within the housing 10, 100.

In order to fasten the module 2 securely in the housing 10, 100, the locating pins 14 of the housing 10, 100 can be caulked once the module 2 has been inserted into the housing 10, 100 in order to produce a force-fitting and form-fitting connection between the housing 10, 100 and the module 2.

In a further step, the connecting cables 20 (this may be one or more connecting cables) are connected to the module 2. For this purpose, the module 2 can preferably be provided with contact-making elements, for example insulation displacement contacts, on that side of said module which is remote from the LED 3 (or else any other desired side), with it being possible for the connecting cables 20 to simply be plugged into said contact-making elements and an electrical connection is thus produced. Alternatively, the locating pins 14 can also be designed to produce an electrical connection between the module 2 and the connecting cable 20 in the above described way. It is also conceivable for a plurality of locating pins 14 to be plugged into locating openings 6, wherein some of the locating pins 14 are caulked once the module 2 has been inserted, while the other locating pins 14 are provided with contact-making elements in order to produce an electrical contact between the module 2 and the connecting cable 20.

In addition, the connecting cables 20 can be introduced into recesses 150 in lateral connecting guides 15 of the housing 10, 100, wherein the recesses 150 have tapers 151, for example in the form of sealing lips, into which the connecting cables 20 can be pressed prior to the introduction of the casting compound. In this way, the connecting cables 20 can be fixed on the housing 10, 100 in sealing fashion, wherein the tapers 151 additionally form strain relief for the connecting cables 20. In addition, the connecting cables 20 can also be fixed in position relative to the contact-making elements of the module 2 or the locating pins 14.

In a further step, a casting compound is then introduced into the housing 10, 100 equipped with the module 2 via an opening 16 in the housing 10, 100. For this purpose, the casting compound is preferably injected via the opening by means of an injection-molding system. The injection-molding system is preferably a two-component or multi-component injection-molding system, wherein the components of the casting compound to be mixed are either mixed prior to being introduced and then injected via a single nozzle or else are injected via two or more nozzles, wherein the two jets converge and preferably mix prior to reaching the target, i.e. the housing 10, 100, or at their intended location. However, the invention is not restricted to the above described systems for introducing the casting compound. Instead, all known methods for introducing a casting compound are also included in the invention.

In this case, the opening 16 can be the same as that which was used for inserting the module 2 into the housing 10, 100. The opening 16 can be formed by a completely or partially open side of the housing 10, 100. Since the housing 10, 100 is also provided with above-described casting blocking means 17 between the module 2 and the housing 10, 100, the entire housing 10, 100 with module 2 and connecting cables 20 is completely filled with casting material or cast internally, apart from a region 19 between the LED 3 and the substantially optically transmissive region 11, 11*a*, 11*b*, 11*c*. The casting blocking means 17, which is preferably in the form of a groove 18, which is formed in the inner side of the housing 10, 100 and around the substantially optically transmissive region 11, 11*a*, 11*b*, 11*c*, interrupts the capillary effect between the housing 10, 100 and the module 2 at the corresponding locations, with the result that the casting compound spreads out throughout the housing 10, 100, apart from the abovementioned region 19 between the LED 3 and the substantially optically transmissive region 11, 11*a*, 11*b*, 11*c*. This ensures that the casting compound does not enter between the LED 3 and the substantially optically transmissive region 11, 11*a*, 11*b*, 11*c*, as a result of which unimpeded emission of the LED towards the outside is ensured given, at the same time, a particularly simple and compact design of the housing 10, 100.

Preferably, the module 2 rests flat on the inner side of the housing 10, 100, on which the casting blocking means 17 is also located. Thus, the ingress of casting compound is additionally made more difficult.

In any case, the housing 10, 100 can be filled with casting material in a particularly simple manner and directly after insertion of the module 2 into the housing 10, 100 without the module 2 being fastened in a particular way, wherein, nevertheless, no casting compound enters the region 19. The introduced casting compound forms a cast body 30, which surrounds and connects the housing 10, 100, the module 2 and the connecting cables 20 safely and in outwardly sealing fashion. The cast body 30 in this case also acts as further strain relief for the connecting cables 20.

The invention is not restricted to the above exemplary embodiments. Any combination of the features and properties mentioned in the exemplary embodiments can be combined as desired.

The invention claimed is:

1. A housed LED module having:
   a module (2) with at least one LED (3) arranged thereon,
   an integral housing (10, 100) with a receptacle for the module (2), a substantially optically transmissive region (11, 11*a*, 11*b*, 11*c*), which enables the emission of light from the LED (3) to the outside, and an opening (16), and
   a casting blocking means (17), which is arranged between the module (2) and the housing (10, 100),
   wherein the casting blocking means (17) comprises a groove (18), which is formed on an inner side of the integral housing (10, 100) and around the substantially optically transmissive region (11, 11*a*, 11*b*, 11*c*) in order to interrupt the capillary effect between the housing (10, 100) and the module (2), such that a compound introduced into the integral housing (10, 100) is prevented from entering into a region (19) between LED (3) and the substantially optically transmissive region (11, 11*a*, 11*b*, 11*c*).

2. The housed LED module as claimed in claim 1, wherein the introduced casting compound forms a cast body (30), which completely fills the housing (10, 100) apart from the region (19) between the LED (3) and the substantially optically transmissive region (11, 11*a*, 11*b*, 11*c*) owing to the casting blocking means (17), and which connects the housing (10, 100), the module (2) and the connecting cable (20) which can be connected to the module (2) in a manner sealed off from the outside.

3. The housed LED module as claimed in claim 1, wherein the module (2) can be introduced into the housing (10, 100) via the opening (16).

4. The housed LED module as claimed in claim 1, wherein the casting blocking means (17) are an integral part of the module (2) and/or the housing (10).

5. The housed LED module as claimed in claim 1, wherein the substantially optically transmissive region (11) has a plurality of substantially optically transmissive regions (11*a*, 11*b*, 11*c*).

6. The housed module as claimed in claim 1, wherein the groove (18) is formed around the entirety of the substantially optically transmissive region (11a, 11b, 11c).

7. The housed LED module as claimed in claim 5, wherein the respective substantially optically transmissive regions (11a, 11b, 11e), individually or in groups, are each provided with a dedicated, independent casting blocking means (17).

8. The housed LED module as claimed in claim 5, wherein the substantially optically transmissive regions (11a, 11b, 11e) are provided in a linear arrangement or at least one of the substantially optically transmissive regions (11a, 11b) is provided so as to be offset with respect to at least one other substantially optically transmissive region (11c).

9. The housed LED module as claimed in claim 3, wherein the module (2) rests flat on that side of the housing (10, 100) which has the groove (18).

10. The housed LED module as claimed in in claim 1, wherein the housing (10, 100) also has positioning means (13) as receptacle for the module (2), which positioning means interact with positioning means (5) of the module (2) in such a way that they fasten and/or center the module (2) in the housing (10, 100).

11. The housed LED module as claimed in claim 10, wherein the positioning means (13) of the housing (10, 100) has at least one locating pin (14), which extends into the housing (10, 100) counter to the plug-in direction (E) of the module (2), and wherein the module (2) is plugged onto the locating pin (14) for fastening and/or centering via corresponding locating openings (6) as positioning means (5).

12. The housed LED module as claimed in claim 11, wherein the at least one positioning pin (14) with the plugged-on module (2) is caulked in order to produce a force-fitting and form-fitting connection between the housing (10, 100) and the module (2).

13. The housed LED module as claimed in claim 11, wherein the at least one positioning pin (14) provides an electrical connection between the module (2) and at least one connecting cable (20) used for making electrical contact with the module (2).

14. The housed LED module as claimed in claim 1, wherein the housing (10, 100) also has lateral connecting guides (15), each having at least one recess (150), in which at least one connecting cable (20) is guided, which connecting cable is used for making electrical contact with the module (2).

15. The housed LED module as claimed in claim 14, wherein the at least one recess (150) has tapers (151), which sectionally reduce the diameter of the recess (150).

16. The housed LED module as claimed in claim 15, wherein the tapers (151) are in the form of sealing lips (152) of the at least one recess (150), into which the at least one connecting cable (20) is pressed in order to fix the connecting cables (20) in sealing fashion in the connecting guides (15).

17. The housed LED module as claimed in claim 1, wherein the module (2) or the housing (10, 100) has contact-making elements for making electrical contact between the module (2) and connecting cables (20).

18. The housed LED module as claimed in claim 17, wherein the contact-making elements are insulation displacement contacts, piercing contacts or crimping contacts.

19. The housed LED module as claimed in claim 1, wherein the casting compound comprises a material with a high thermal conductivity.

20. The housed LED module as claimed in claim 1, wherein the casting compound comprises a material with a high thermal conductivity higher than 0.3 W/(m*K).

21. A housed LED system having:
a module (2) with at least one LED (3) arranged thereon, and
an integral housing (10, 100) with a receptacle for the module (2), a substantially optically transmissive region (11, 11a, 11b, 11c), which enables the emission of light from the LED (3) to the outside, and an opening (16),
a casting blocking means (17), which is arranged between the module (2) and the housing (10, 100), and
connecting cables (20), which have been brought into electrical contact with the module (2),
wherein the casting blocking means (17) have a groove (18), which is formed in the inner side of the housing (10, 100) and around the substantially optically transmissive region (11, 11a, 11b, 11c) in order to interrupt the capillary effect between the housing (10, 100) and the module (2) such that a compound introduced into the integral housing (10, 100) is prevented from entering into a region (19) between LED (3) and the substantially optically transmissive region (11, 11a, 11b, 11c).

22. An LED chain having at least two of the housed LED modules (1) as claimed in claim 1, wherein the housed LED modules (1) are fitted at any desired positions on connecting cables (20).

23. The LED chain as claimed in claim 22, wherein the connecting cables (20) are flexible.

24. The housed LED module as claimed in claim 7, wherein said dedicated, independent casting blocking means (17) is formed in the form of a peripheral groove (18) in each case around a corresponding group of substantially optically transmissive regions (11a, 11b, 11c).

25. The housed LED module as claimed in claim 19, wherein said high thermal conductivity material is selected from a group consisting of polyurethane, silicone resin, epoxy resin, or the like.

26. The housed LED module as claimed in claim 20, wherein said material has a thermal conductivity higher than 0.5 W/(m*K).

* * * * *